United States Patent [19]

Uemura et al.

[11] Patent Number: 5,319,594
[45] Date of Patent: Jun. 7, 1994

[54] SEMICONDUCTOR MEMORY DEVICE INCLUDING NONVOLATILE MEMORY CELLS, ENHANCEMENT TYPE LOAD TRANSISTORS, AND PERIPHERAL CIRCUITS HAVING ENHANCEMENT TYPE TRANSISTORS

[75] Inventors: Teruo Uemura, Kawasaki; Yukio Kawase, Yokohama, both of Japan

[73] Assignee: Kabushiki Kaisha Toshiba, Kawasaki, Japan

[21] Appl. No.: 76,379

[22] Filed: Jun. 14, 1993

Related U.S. Application Data

[63] Continuation of Ser. No. 648,299, Jan. 31, 1991, abandoned.

[30] Foreign Application Priority Data

Feb. 1, 1990 [JP] Japan ................................. 2-20442

[51] Int. Cl.$^5$ ............................................. G11C 11/34
[52] U.S. Cl. ................................. 365/185; 365/189.11
[58] Field of Search ............... 365/182, 204, 230.06, 365/185, 189.11

[56] References Cited

U.S. PATENT DOCUMENTS

| | | | |
|---|---|---|---|
| 3,938,108 | 2/1976 | Salsbury et al. | 365/182 |
| 4,387,447 | 6/1983 | Klaas et al. | 365/204 |
| 4,571,705 | 2/1986 | Wada | 365/195 |
| 4,575,823 | 3/1986 | Fitzpatrick | 365/184 |
| 4,751,678 | 6/1988 | Raghunathan | 365/189.09 |
| 4,813,018 | 3/1989 | Kobayashi et al. | 365/185 |
| 5,018,107 | 5/1991 | Yoshida | 365/230.06 |
| 5,043,945 | 8/1991 | Bader | 365/204 |
| 5,051,953 | 9/1991 | Kitazawa | 365/230.06 |
| 5,142,496 | 8/1992 | Van Buskirk | 365/185 |
| 5,182,725 | 1/1993 | Andoh et al. | 365/185 |
| 5,198,998 | 3/1993 | Kobatake | 365/185 |

*Primary Examiner*—Eugene R. LaRoche
*Assistant Examiner*—Son Dinh
*Attorney, Agent, or Firm*—Finnegan, Henderson, Farabow, Garrett & Dunner

[57] ABSTRACT

A semiconductor memory device comprises a nonvolatile memory cell array having a plurality of memory cells, enhancement type load transistors having a threshold voltage, and at least one peripheral circuit, such as level shifters, a column decoder, etc., including enhancement type transistors having a threshold voltage. For increasing the writing speed of the memory cells, the threshold voltage of the enhancement type load transistors is set so that it is different from that of the enhancement type transistors of the peripheral circuit. For example, the threshold voltage of the enhancement type load transistors is lower than that of the enhancement type transistors of the peripheral circuit.

4 Claims, 5 Drawing Sheets

SEMICONDUCTOR MEMORY DEVICE INCLUDING NONVOLATILE MEMORY CELLS, ENHANCEMENT TYPE LOAD TRANSISTORS, AND PERIPHERAL CIRCUITS HAVING ENHANCEMENT TYPE TRANSISTORS

This application is a continuation of application Ser. No. 07/648,299 filed Jan. 31, 1991, now abandoned.

BACKGROUND OF THE INVENTION

1. Field of the Invention

This invention relates to a semiconductor memory device, and more particularly to a semiconductor memory device including nonvolatile memory cell transistors.

2. Description of the Related Art

EPROMs (Erasable Programmable Read Only Memory), i.e., charge-injection type nonvolatile semiconductor devices, have been manufactured by the method shown in FIGS. 5A-5D. In these figures, broken line 101 indicates the border between a memory cell and a load transistor, and broken line 102 the border between the load transistor and a peripheral circuit.

In the method, at first, a field oxide film 42 and a gate oxide film 43 are provided on a semiconductor substrate 41, as shown in FIG. 5A. The semiconductor substrate surface is coated with a resist layer 44, as shown in FIG. 5B. Using photolithography techniques, the resist film 44 is selectively removed to provide a window 46 for forming a channel region 45 of the memory cell transistor therein. Subsequently, impurity ions are implanted into the substrate through the window 46, followed by removing the resist film 44. As shown in FIG. 5C, the substrate surface is coated with a resist film 47, and using photolithography techniques, the resist film 47 is selectively removed to provide windows 50 and 51 for forming channel regions 48 and 49 of the load transistor and peripheral transistor, respectively. Thereafter, impurity ions are implanted into the substrate through these windows 50 and 51, and then the resist film 47 is removed. Finally, as shown in FIG. 5D, a floating gate 52, an oxide film 53 (provided between control and floating gates), a control gate 54, gate electrodes 55, diffused regions 56, an insulating film 57, an Al wiring layer 58, and a passivation film 59 are successively provided.

The channel regions of the load transistors are formed by the same impurity ion implantation process (the same dose) as that of making the channel regions of enhancement type transistors used in peripheral circuits. Accordingly, each load transistor has a threshold voltage equal to that of each enhancement type transistor.

The semiconductor memory device described above, however, has the following disadvantage.

In general, the peripheral circuit includes at least one enhancement type transistor whose source potential is different from the substrate potential. The substrate is then biased relative to the source of the enhancement type transistor. Therefore, the threshold voltage may be increased under an operating condition in the enhancement type transistor of the peripheral circuit. The threshold voltage is usually measured in a state in which the source and the substrate of the transistor are kept at the same potential. The threshold voltage may be also increased in each enhancement type load transistor connected to each memory cell transistor, because the source of the load transistor is not kept at the same potential as that of the substrate. In the enhancement type load transistor connected to the memory cell transistor, a voltage drop corresponding to the threshold voltage (Vth) may occur, which will make the voltage applied to the memory cell transistor lower than the voltage applied to a power supply voltage terminal. When the voltage applied to the memory cell transistor is lowered, the electric field between the drain and source regions may be decreased to reduce the quantity of generated carrier. Consequently, the writing speed to the memory cell may be lowered.

On the one hand, since current leakage occurs between the source and drain regions of the transistors in the peripheral circuits, it is not possible to set the threshold voltage of each enhancement type transistor at a low value. On the other hand, each enhancement type load transistor has a comparatively long gate length (L poly), so the problem of the current leakage may not occur. Therefore, it may be possible to set the threshold voltage at a low value.

As described above, in the conventional semiconductor memory device including charge-injection type nonvolatile memory cell transistors, the voltage applied from the power supply may be greatly lowered in the enhancement type load transistors, thereby decreasing the writing speed into the memory cells.

SUMMARY OF THE INVENTION

It is an object of the invention to provide a semiconductor memory device having a high writing speed.

It is another object of the invention to provide a semiconductor memory device in which a voltage supplied from a power supply is not greatly lowered by load transistors incorporated therein.

According to one aspect of the present invention, there is provided a semiconductor memory device which comprises a nonvolatile memory cell array having a plurality of memory cells, enhancement type load transistors having a threshold voltage, and at least one peripheral circuit, such as level shifters, column decoder, etc., including enhancement type transistors having a threshold voltage. For increasing the writing speed of the memory cells, the threshold voltage of each of the enhancement type load transistors is set so that it is different from that of the enhancement type transistors of the peripheral circuit. For example, the threshold voltage of the enhancement type load transistors is lower than that of the enhancement type transistors of the peripheral circuit.

BRIEF DESCRIPTION OF THE DRAWINGS

The novel and distinctive features of the invention are set forth in the claims appended to the present application. However, the invention together with further objects and advantages thereof may best be understood by reference to the following description and accompanying drawings in which:

DETAILED DESCRIPTION OF THE PREFERRED EMBODIMENTS

A semiconductor memory device according to an embodiment of the present invention will be described in detail with reference to the drawings.

In FIGS. 1A through 1E, broken line 1 indicates the border between a memory cell and a load transistor, and broken line 2 represents the border between the load transistor and a peripheral circuit, respectively.

Figure 1A:
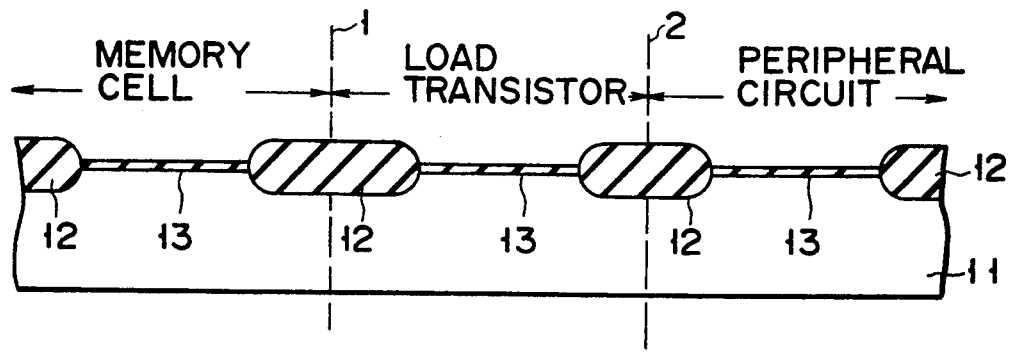
FIGS. 1A through 1E are partial sectional views for explaining a semiconductor memory device and control of a threshold voltage of circuit elements according to one embodiment of the present invention.

As shown in FIG. 1A, a field oxide film 12 and a gate oxide film 13 are formed on a semiconductor substrate 11 by means of LOCOS (Local Oxidation of Silicon) techniques.

Figure 1B:
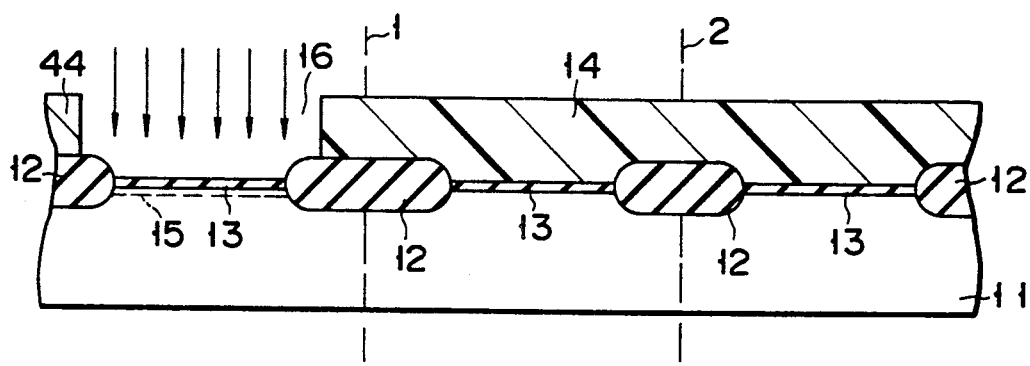

Then, as shown in FIG. 1B, after the substrate surface is coated with a resist film 14, using photolithography techniques the resist film 14 is selectively removed to provide a window 16 for forming a channel region 15 of the memory cell transistor therein. Subsequently, impurity ions are implanted into the substrate through the window 16, followed by removing the resist film 14.

Figure 1C:
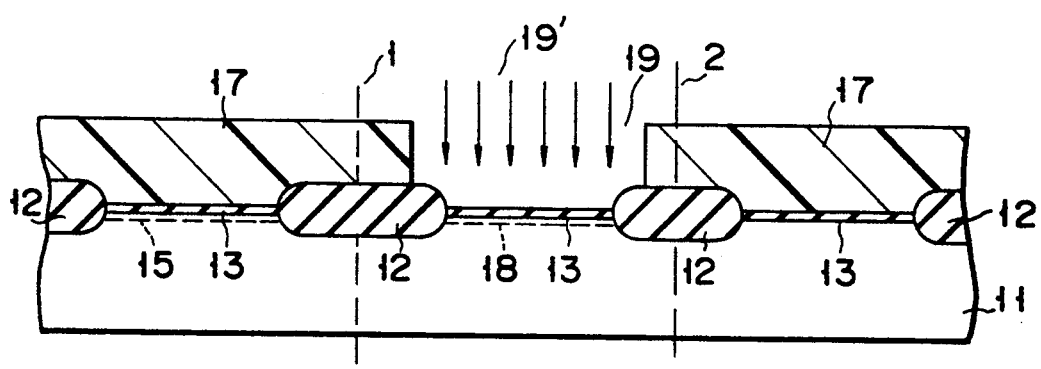

As shown in FIG. 1C, the substrate surface is coated with a resist film 17, and using photolithography techniques the resist film 17 is selectively removed to provide a window 19 for forming a channel region 18 of the load transistor therein. Thereafter, an ion implatation is carried out through the window 19 so that the threshold voltage of the load transistor may become 0.6 V, and the resist film 17 is removed from the substrate surface.

Figure 1D:
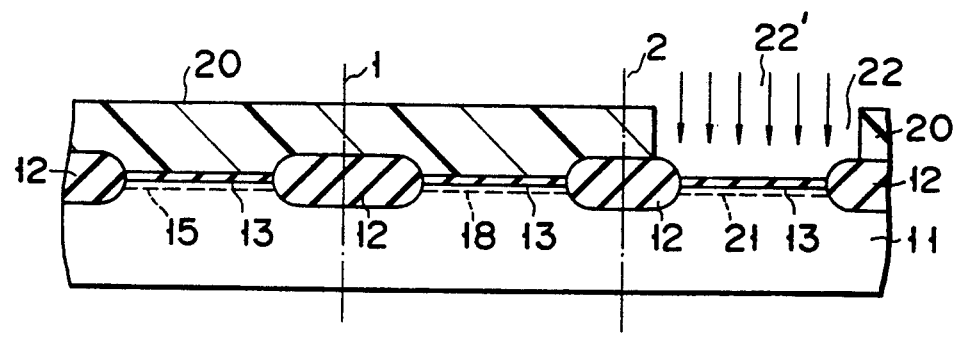

Subsequently, as shown in FIG. 1D, the substrate surface is coated with a resist film 20, and using photolithography techniques the resist film 20 is selectively etched to provide a window 22 for forming a channel region 21 of an enhancement type transistor included in peripheral circuits. Impurity ions are implanted into the substrate so that the threshold voltage of the enhancement type transistor may become 0.8 V. The resist film 20 is then removed from the substrate surface.

Figure 1E:
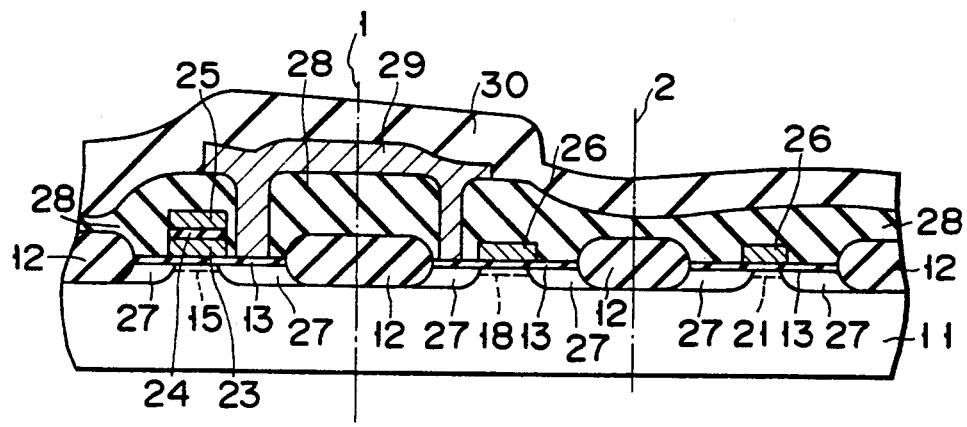

Finally, as shown in FIG. 1E, a floating gate 23, a control gate 25, an oxide film 24 provided between the gates 23 and 25, gate electrodes 26, diffused regions 27 (source and drains regions), an insulating films 28, an Al wiring layer 29, and a passivation film 30 are successively provided.

In the present invention as described above, the channel regions of both the enhancement type load transistor and the enhancement type transistor in the peripheral circuit are subjected to the different ion implantation processes to control the threshold voltage thereof, while they are subjected to the same ion implantation process in the conventional device.

The power consumption of the memory cell transistors can be reduced when the threshold voltage of each enhancement type load transistor connected to each memory cell transistor is made higher than that of each enhancement type transistor included in the peripheral circuits.

Further, even if a semiconductor memory device includes 5 V system transistors and high voltage system transistors to render a different thickness in their gate oxide films, a semiconductor substrate may be subjected to different ion implantation processes to provide channel regions for load transistors, 5 V system transistors and high voltage system transistor, respectively.

Figure 2A:
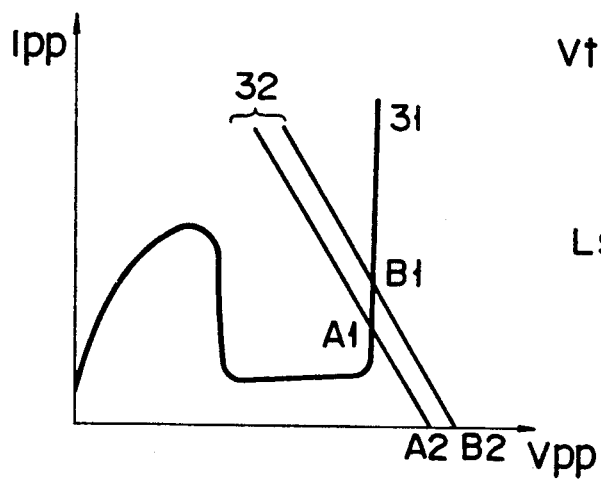
FIGS. 2A and 2B are graphs showing the characteristics of the semiconductor memory device according to the embodiment of the present invention.
Figure 2B:
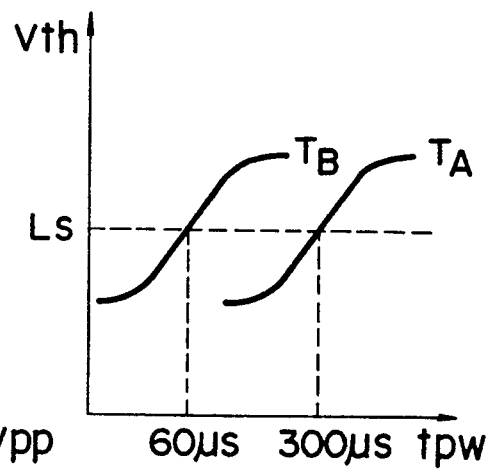

FIG. 2A shows a static characteristic 31 of the EPROM cell and load characteristics 32 of the load transistor. In this figure, Vpp is the voltage applied between source and drain regions of the memory cell, and Ipp is the current flowing therebetween. A1 and A2 indicate an operating point of a writing circuit and a voltage applied to the drain region of the cell when the load transistor has the threshold voltage of 0.8 V, respectively. B1 and B2 indicate the operating point of the writing circuit and the voltage applied to the drain region of the cell when the load transistor has the threshold voltage of 0.6 V, respectively. As can be understood from the graph, when the threshold voltage of the load transistor is low, the current Ipp flowing through the cell at the operating point of the writing circuit may be increased. Therefore, the writing characteristic of the memory cells may be improved. FIG. 2B shows the writing characteristics as an improvement of a writing speed. In the figure, $t_{pw}$ is the writing time into the memory cell, and Vth is the threshold voltage of the memory cell. Curves $T_A$ and $T_B$ indicate the writing characteristic when the threshold voltage of the load transistor is 0.8 V and 0.6 V, respectively. In this case, the writing time is the time required for that the threshold voltage of the memory cell transistor reaches a sense level (Ls). Therefore, the writing time is given by 300 μs in $T_A$ and by 60 μs in $T_B$, respectively. Accordingly, if the threshold voltage is decreased by only 0.2 V, the writing speed may be increased by 5 times.

Figure 3:
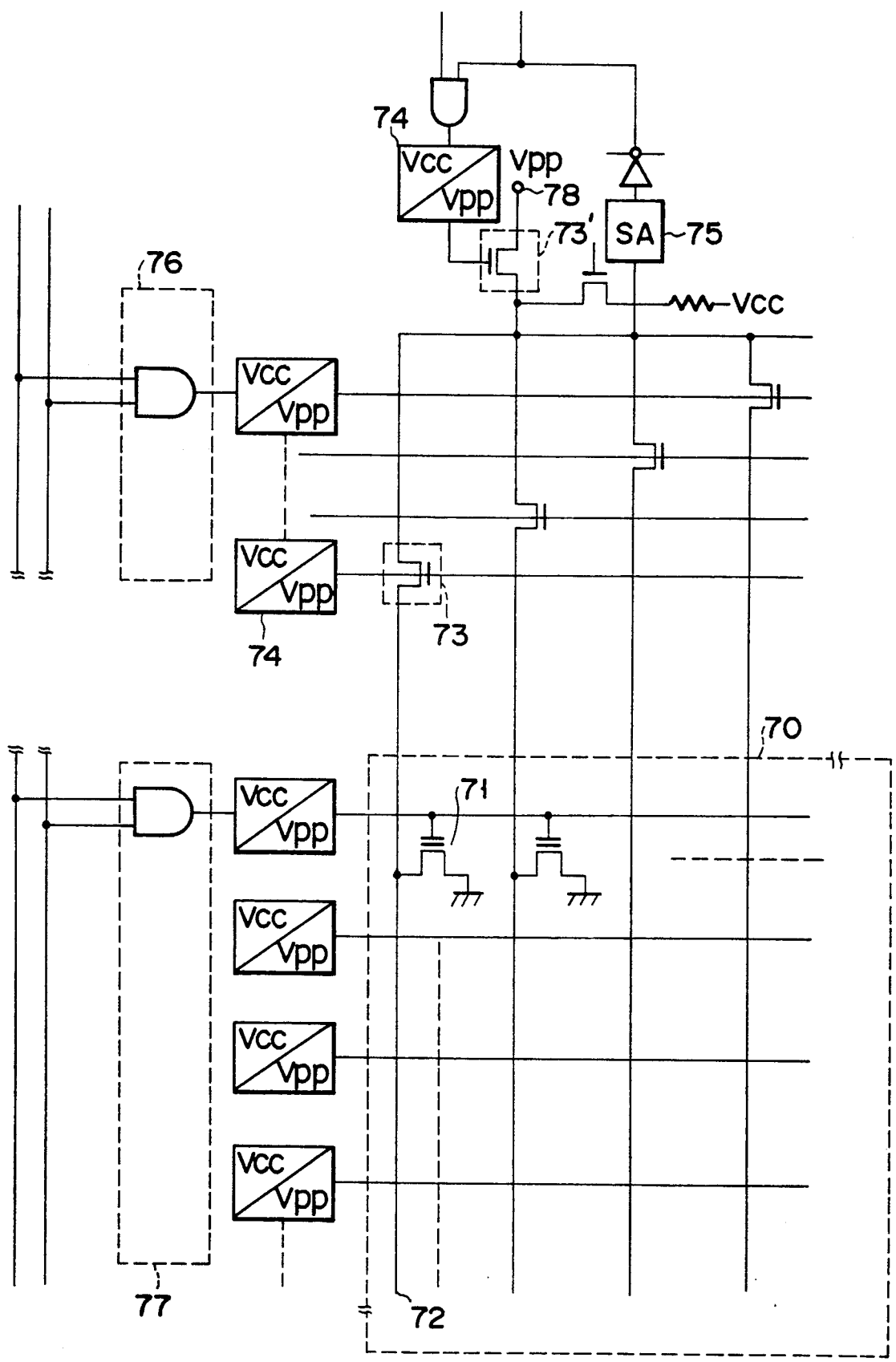
FIG. 3 is a circuit diagram showing a structure of the semiconductor memory device according to the embodiment of the present invention.

FIG. 3 shows a circuit configuration of the EPROM, which includes an array 70 of charge-injection type memory cell transistors 71, enhancement type load transistors 73 for selecting respective columns 72, level shifters 74, a sense amplifier 75, column decoders 76, row decoders 77, and the like. In FIG. 3, the enhancement type transistors 73 and 73' are enhancement type load transistors for the charge-injection type non-volatile memory cell transistors 71. The level shifters 74 and column decoders 76 are connected to the enhancement type load transistors 73 and 73' and provide one of the peripheral circuits including enhancement type transistors.

A voltage Vpp (e.g. 12 V) is applied to the enhancement type load transistors 73 and 73' through a power supply voltage terminal 78 to perform writing to a desired memory cell transistor 71. For carrying out a reading operation of the memory cell transistor 71, a voltage Vcc (e.g. 5 V) is applied through the corresponding enhancement type load transistor 73 thereto.

Figure 4A:
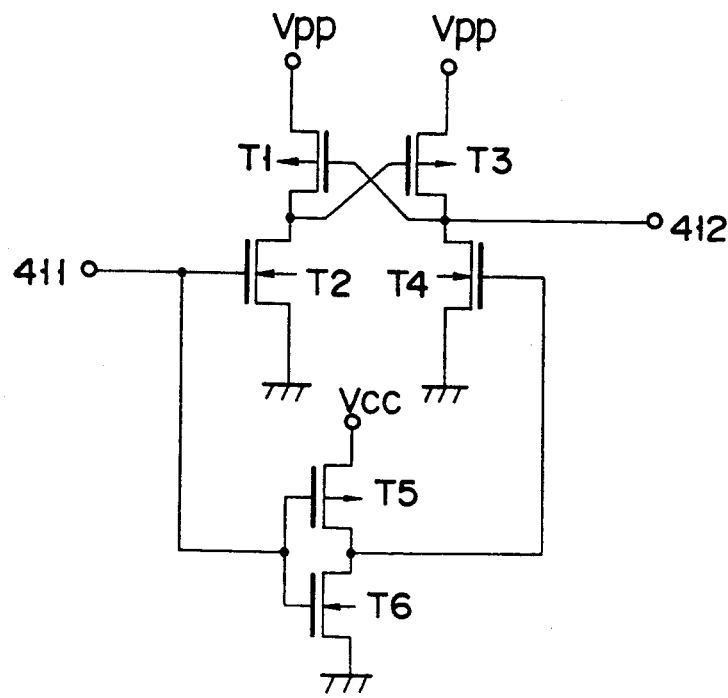
FIGS. 4A and 4B are circuit diagrams showing peripheral circuits shown in FIG. 3.
Figure 4B:
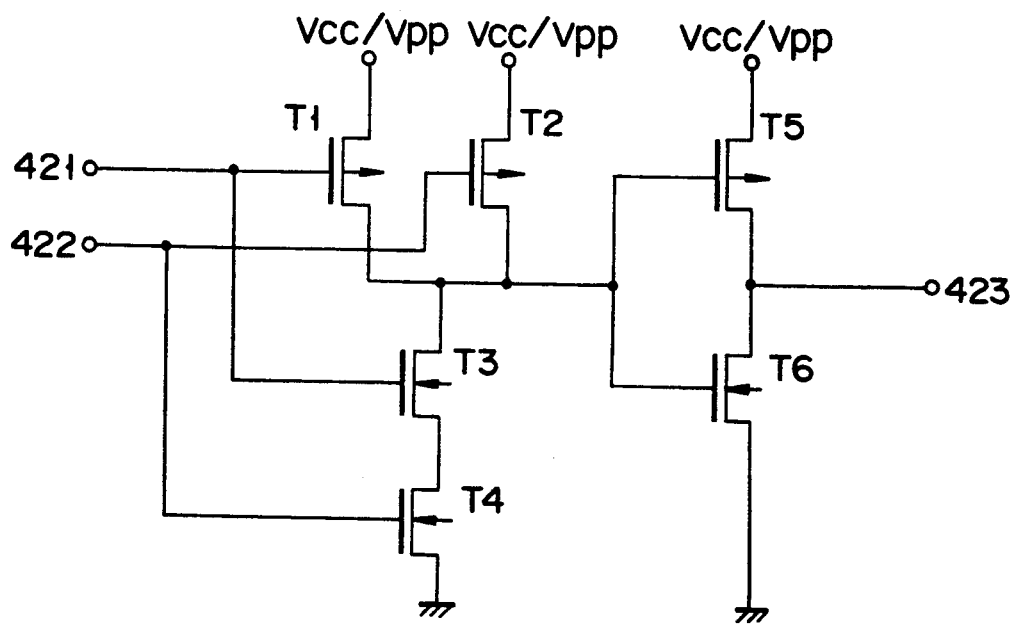
Figure 5A:
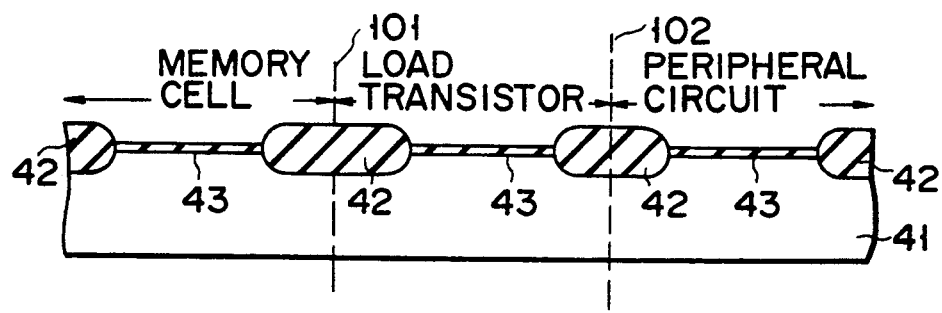
FIGS. 5A through 5D are partial sectional views explaining control of a threshold voltage of circuit elements in a conventional semiconductor memory device.
Figure 5B:
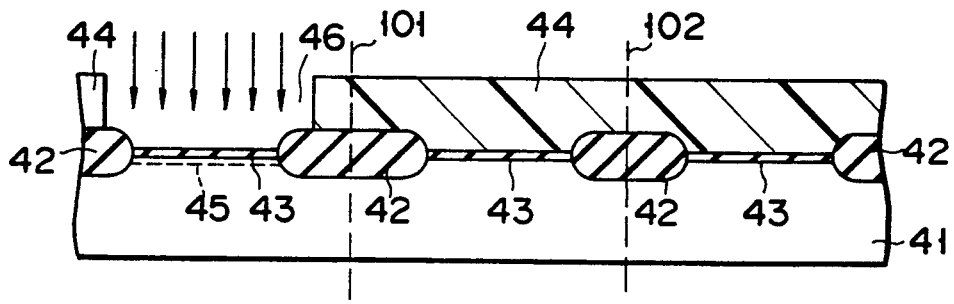
Figure 5C:
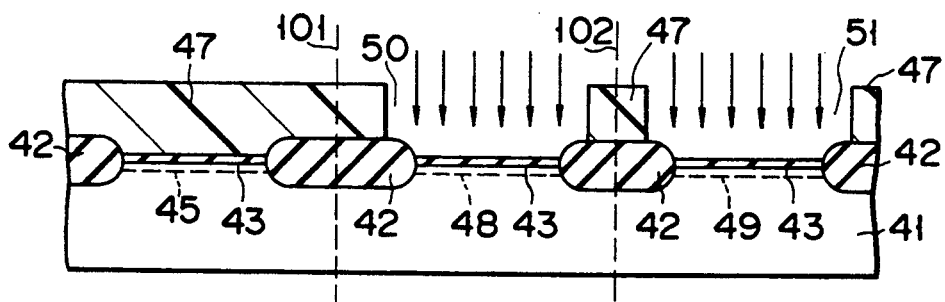
Figure 5D:
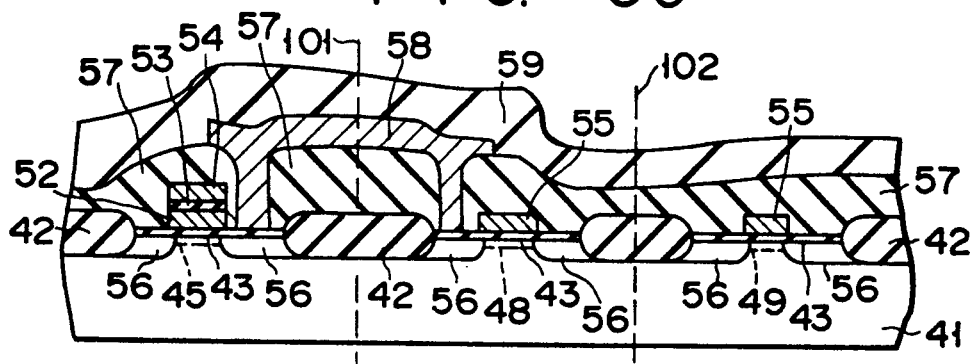

FIGS. 4A and 4B show one example of the known level shifter 74, and decoders 76 and 77, shown in FIG. 3, which provide the peripheral circuits. These circuits include enhancement type field effect transistors.

Specifically, in the level shifter 74 shown in FIG. 4A, a first series circuit, comprised of an N-channel transistor T1 and a P-channel transistor T2, and a second series circuit, comprised of an N-channel transistor T3 and a P-channel transistor T4, are connected in parallel between a power supply voltage (Vpp) terminal and a ground terminal. The connection point between the transistors T1 and T2 is connected to the gate of the transistor T3, while the connection point between the transistors T3 and T4 is connected to the gate of the transistor T1. Further, an inverter comprised of an N-channel transistor T5 and a P-channel transistor T6 is connected between a power supply voltage (Vcc) terminal and a ground terminal. The gates of the transistors T5 and T6 are connected to the gate of the transistor T2 in common, while the connection point between the transistors T5 and T6 is connected to the gate of the transistor T4. An input terminal 411 is connected to the gate of the transistor T2, and an output terminal 412 is connected to the connection between the transistors T3 and T4. Upon supply of an input signal, the voltage Vpp is fed from the output terminal 412.

The decoders 76 and 77 shown in FIG. 4B have the same circuit configuration. In the decoder, P-channel transistors T3 and T4 are connected in series with a parallel circuit comprised of N-channel transistors T1 and T2. The gate of the transistor T3 is connected to the gate of the transistor T1 and to a first input terminal 421, and the gate of the transistor T4 is connected to the gate of the transistor T2 and to a second input terminal 422, thereby providing a NAND circuit. The NAND circuit is connected in series with an inverter provided by an N-channel transistor T5 and a P-channel transistor T6. The connection point between the transistors T5 and T6 is connected to an output terminal 423. A power supply Vcc/Vpp is connected to one end of the transistors T1, T2 and T5 to perform a decoding operation.

The present invention can be also applied in the case where the threshold voltage of the enhancement type load transistor is different from a threshold voltage of each enhancement type transistor included in the sense amplifiers or in I/O buffers.

Further, the present invention is not limited to the EPROM mentioned above, but it will be applicable to EEPROMs (Electrically Erasable and Programmable Read Only Memories).

According to the present invention as described above, in the semiconductor memory device including charge-injection type nonvolatile memory cell transistors, the voltage supplied from the power supply will not be greatly lowered by the enhancement type load transistors, resulting in the high writing speed.

It is further understood by those skilled in the art that the foregoing description is a preferred embodiment of the disclosed device and that various changes and modifications may be made in the invention without departing from the spirit and scope thereof.

What is claimed is:

1. A semiconductor device comprising:
   a semiconductor substrate;
   a plurality of row lines provided above the semiconductor substrate;
   a plurality of column lines provided above the semiconductor substrate;
   an array of nonvolatile memory cells arranged in rows and columns to be selected by signals from the row lines and from the column lines;
   a writing circuit including an enhancement type first load transistor connected in series with a plurality of enhancement type second load transistors, each of the first and second load transistors having a first threshold voltage, and one of the plurality of enhancement type second load transistors being connected to a corresponding one of the plurality of column lines;
   a first group of peripheral circuits including enhancement type transistors, each of the enhancement type transistors having a second threshold voltage and being connected to each of the plurality of row lines; and
   a second group of peripheral circuits including enhancement type transistors, each of the enhancement type transistors having the second threshold voltage and controlling each of the second load transistors, wherein
   the first threshold voltage is lower than the second threshold voltage to increase a writing speed.

2. The semiconductor memory device according to claim 1, wherein the first threshold voltage is approximately 0.6 V and the second threshold voltage is approximately 0.8 V.

3. The semiconductor memory device according to claim 1, wherein the first group of peripheral circuits includes a plurality level shifters connected in series with a row decoder.

4. The semiconductor memory device according to claim 1, wherein the second group of peripheral circuits includes a plurality of level shifters connected in series with a column decoder.

* * * * *